United States Patent [19]
Jang

[11] Patent Number: 5,438,005
[45] Date of Patent: Aug. 1, 1995

[54] DEEP COLLECTION GUARD RING

[75] Inventor: Wen-Yueh Jang, Hsin Chu, Taiwan

[73] Assignee: Winbond Electronics Corp., Hsinchu, Taiwan

[21] Appl. No.: 227,356

[22] Filed: Apr. 13, 1994

[51] Int. Cl.6 ......................................... H01L 21/8238
[52] U.S. Cl. ........................................ 437/34; 437/58; 437/75; 437/162; 148/DIG. 82
[58] Field of Search .................. 437/31, 29, 34, 46, 437/56, 58, 59, 70, 74, 75, 79, 162, 164; 148/DIG. 70, DIG. 82, DIG. 85, DIG. 86

[56] References Cited

U.S. PATENT DOCUMENTS

| | | | |
|---|---|---|---|
| 3,986,896 | 10/1976 | Ueno et al. | 148/DIG. 70 |
| 4,762,802 | 8/1988 | Parrillo | 148/DIG. 82 |
| 4,920,066 | 4/1990 | Hong et al. | 437/56 |

FOREIGN PATENT DOCUMENTS

| | | | |
|---|---|---|---|
| 0211263 | 12/1982 | Japan | 437/79 |
| 2007558 | 1/1990 | Japan | 437/57 |

OTHER PUBLICATIONS

Sze, "VLSI Technology", 1988, pp. 272, 311–314.

*Primary Examiner*—Brian E. Hearn
*Assistant Examiner*—Tuan Nguyen
*Attorney, Agent, or Firm*—Meltzer, Lippe, Goldstein et al.

[57] ABSTRACT

A CMOS device is provided with a deep collector guard ring. The guard ring is formed by thermally deep diffusing impurities from a poly layer into the surface of a well beneath the poly layer. The guard ring can thus be easily manufactured using CMOS compatible fabrication processes to a depth which is greater than the source and drain regions of the CMOS device.

7 Claims, 7 Drawing Sheets

DEEP COLLECTION GUARD RING

FIELD OF INVENTION

The present invention relates to a deep collection guard ring for use in a CMOS device to prevent latch-up.

BACKGROUND OF THE INVENTION

A conventional CMOS device is illustrated in FIG. 1. The CMOS device 10 comprises a silicon substrate 12 which illustratively is N-type. The dopant concentration of the N-type substrate is $2 \times 10^{15}/cm^3$. A P-well 14 is formed on the surface of the substrate 12 by diffusion for example. The depth of the P-well 14 is 1.8 $\mu$m and the dopant concentration of the P-well is $8 \times 10^{16}/cm^3$. An N-well 16 is also formed on the surface of the substrate 12. The N-well 16 has a depth of 2 $\mu$m and a dopant concentration of $6 \times 10^{16}/cm^3$.

The CMOS device 10 comprises a P-MOS device 20 formed in the N-well 16 and an N-MOS device 30 formed in the P-well 14. The P-MOS device 20 comprises a source region 24 and a drain region 22 separated by a channel 26. The gate 28 which is connected to the input voltage $V_{in}$ controls the conductivity of the channel 26. The source 24 is connected to the positive supply voltage $V_{DD}$. The source and drain regions 24 and 22 are doped P+type with a dopant concentration of $10^{20}/cm^3$ and a depth of 0.25 $\mu$m. The positive supply voltage $V_{DD}$ is also connected to the N+type surface contact region 29 which may be used in addition to the gate 28 for controlling the channel 26. The N+contact 29 has a depth of 0.2 $\mu$m and a dopant concentration of $10^{20}/cm^3$.

The N-MOS device 30 formed in the P-well 14 has a source region 34 and a drain region 32 separated by a channel 36. The gate 38 which is connected to $V_{in}$ in controls the conductivity of the channel 36. The source 34 is connected to the negative supply voltage $V_{ss}$. The source and drain regions 34 and 32 are doped P+type with a concentration of $10^{20}/cm^3$ and a depth of 0.25 $\mu$m. The negative supply voltage $V_{ss}$ is also connected to the P+type surface contact region 39. The contact region 39 can be used in addition to the gate 38 for controlling the channel 36. The P+region 39 has a depth of 0.25 $\mu$m and a dopant concentration of $10^{20}/cm^3$.

There are two parasitic bipolar junction transistors in the CMOS device 10 of FIG. 1. The parasitic bipolar junction transistors are labeled $T_1$ and $T_2$. $T_1$ is a PNP transistor with a collector resistance $R_p$. $T_2$ is an NPN transistor with a collector resistance $R_N$. $T_1$ is formed by the P+source and drain regions 22 and 24 and the bulk of the P-well 14 and N-well 16. $T_2$ is formed by the N+source and drain regions 32 and 34 and the bulk of the N-well 16 and P-well 14. The two parasitic transistors $T_1$ and $T_2$ form a parasitic thyristor. This thyristor normally has no effect as $T_1$ and $T_2$ are in the off state. However, under some circumstances the thyristor $T_1$ and $T_2$ may fire. In this case, the parasitic transistors $T_1$ and $T_2$ are turned on, thereby short circuiting the positive supply voltage $V_{DD}$ to the negative supply voltage $V_{ss}$. The resulting high currents will destroy the CMOS device 10. This effect is called the "latch-up" effect. The "latch-up" effect is described in detail in U. TETZE & C. SCHENK, ELECTRONIC CIRCUITS: DESIGN AND APPLICATIONS, pp. 193–194 (1991).

A variety of techniques have been proposed in the prior art to provide immunity with respect to latch-up. These techniques generally involve reducing the current gains of the transistors $T_1$ and $T_2$ and the resistances $R_p$ and $R_N$. The prior art techniques include, for example, heavy doped substrate EPI wafer, retrograde well-etc.

These techniques generally involve lengthening the distance between the P+region 22 and the N+region 32, thus inevitably reducing the packing density of CMOS devices in an integrated circuit. To achieve a balance between packing density and latch-up immunity, a P+type guard ring 52 is formed in the P-well 14 and N+type guard ring 62 is formed in the N-well 16. The purpose of the guard ring 62 is to collect the current flowing to the base of $T_1$ and the purpose of the guard ring 52 is to collect the current flowing to the base of $T_2$. The current collected by the guard ring 62 is designated $i_1'$ and the current collected by the guard ring 52 is designated $i_2'$.

As the fabrication process of a CMOS integrated circuit improves, the size of the device 10 scales down and the distance between N+region 32 and P+region 22 decreases. In addition, the depth of the P-well 14 and N-well 16 becomes shallow. Consequently, the value of the current gains of $T_1$ and $T_2$ increase as do the resistances $R_p$ and $R_N$. This makes it easier for latch-up to occur. In particular, the depth of the guard ring is generally equal to the depth of the source and drain regions. This limits the ability of the guard rings to collect the base currents of the parasitic bipolar junction transistors. To overcome this disadvantage, the width of the guard rings is usually increased at the expense of circuit packing density.

In view of the foregoing, it is an object of the present invention to provide a CMOS device which overcomes the above-described disadvantages of the prior art. In particular, it is an object of the invention to provide a CMOS device having a guard ring which provides immunity against latch-up and which also does not substantially reduce circuit packing density.

SUMMARY OF THE INVENTION

In accordance with an illustrative embodiment of the present invention, a buried contact is formed in a CMOS device to serve as a guard ring. Illustratively, the buried contact is formed in the P-well and has an N+doping. The buried contact may be formed before the source and drain regions of the P-MOS device and N-MOS device are formed and, therefore, the buried contact guard ring may be formed much deeper than the source and drain regions. When the guard ring is deep, its ability to collect base current is enhanced. As a result, the latch-up immunity is enhanced without having to substantially reduce the circuit packing density. The performance characteristics of the CMOS device are not effected by the inventive buried contact guard ring.

The buried contact guard ring is formed as follows. A polycrystalline silicon material heavily doped with, for example, N-type impurities, is formed on the surface of the N-well where the guard ring is to be formed. Then the guard ring is then formed by thermally diffusing the N-type impurities from the polycrystalline silicon deeply into the N-well. Thus, a heavily doped, deep buried N+region is formed beneath the polycrystalline silicon material. Likewise, a heavily doped, deep buried P+region can alternatively, or additionally, be formed in the P-well beneath a polycrystalline silicon material which is heavily doped with P-type impurities.

In short, a deep collector guard ring and method for its manufacture are disclosed which prevent latch-up without substantially reducing circuit packing density.

DETAILED DESCRIPTION OF THE INVENTION

Figure 1:
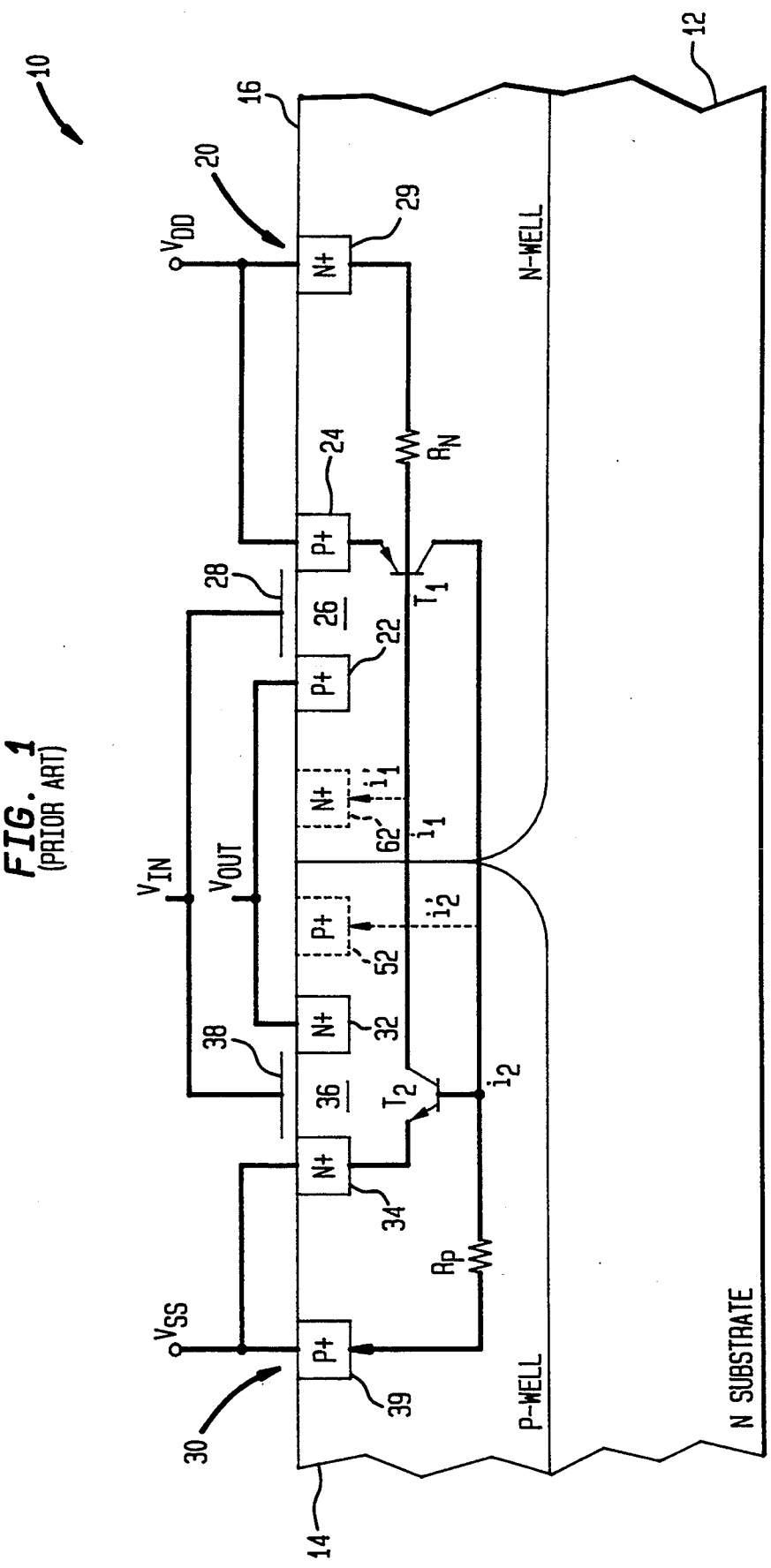
FIG. 1 shows a conventionally CMOS device which is susceptible to latch-up.
Figure 2A:
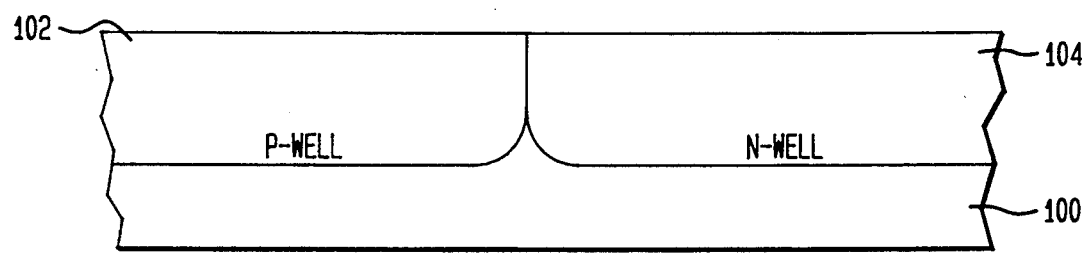
FIGS. 2A–2E illustrates the process steps for fabricating a deep collector guard ring according to one embodiment of the present invention.
Figure 2B:
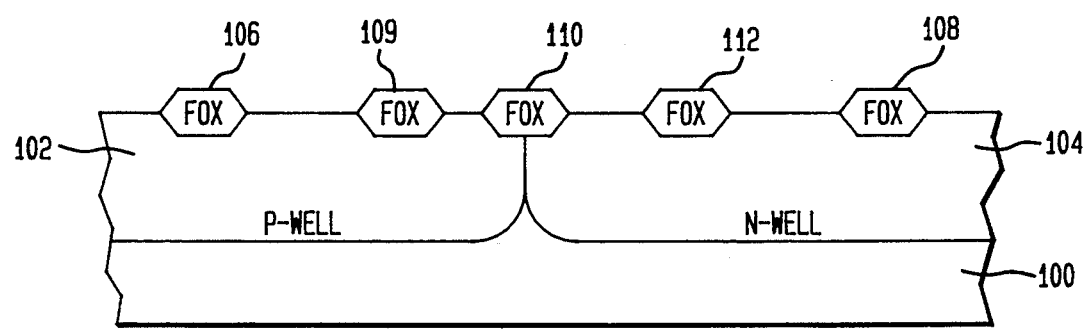
Figure 2C:
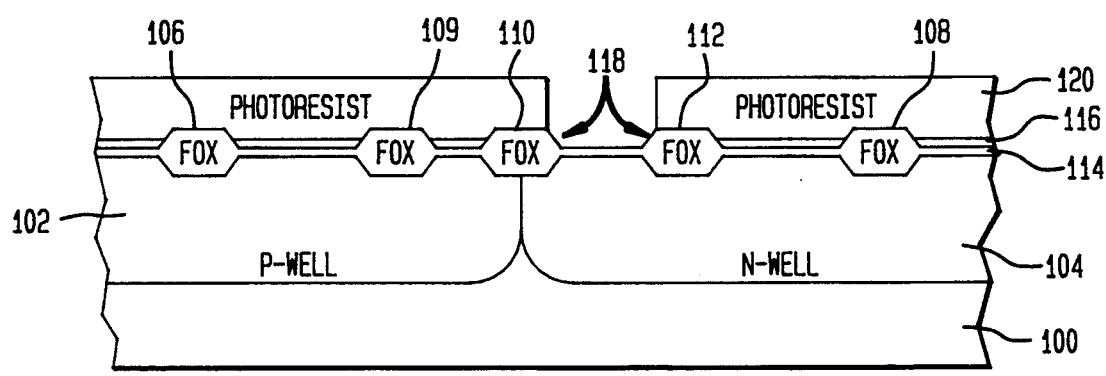
Figure 2D:
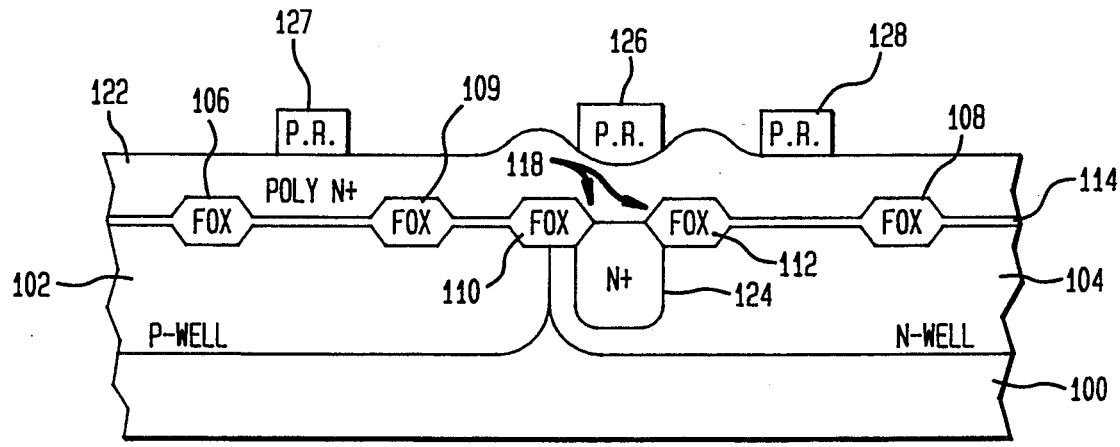

FIG. 2 shows a process for fabricating a CMOS device according to the present invention with a deep collector guard ring. In step A, a P-well 102 and an N-well 104 are formed in a substrate 100 by, for example, implantation or diffusion. Next, in step B, field oxide (fox) regions 106, 108, 109, 110 and 112 are formed at selected locations of the surface of the P-well 102 and N-well 104. The fox regions 106, 108, 110 and 112 may, for example, be $SiO_2$.

In step C, a thin gate oxide layer 114 is grown on the surface of the P-well 102 and the N-well 104 (and exposed surface of portions of substrate 100 not shown). Thereafter, a thin polycrystalline silicon (poly) layer 116 is formed on the thin gate oxide layer 114. A photoresist layer 120 is then formed on the thin poly layer 116. Then photoresist is removed from the window 118 using a photo-lithographic technique. The thin poly and thin gate oxide layer 116 and 114 on the exposed window 118 are then removed, e.g., by etching (as shown in step D) to expose a window 118 of the surface of the N-well 104.

Figure 3:
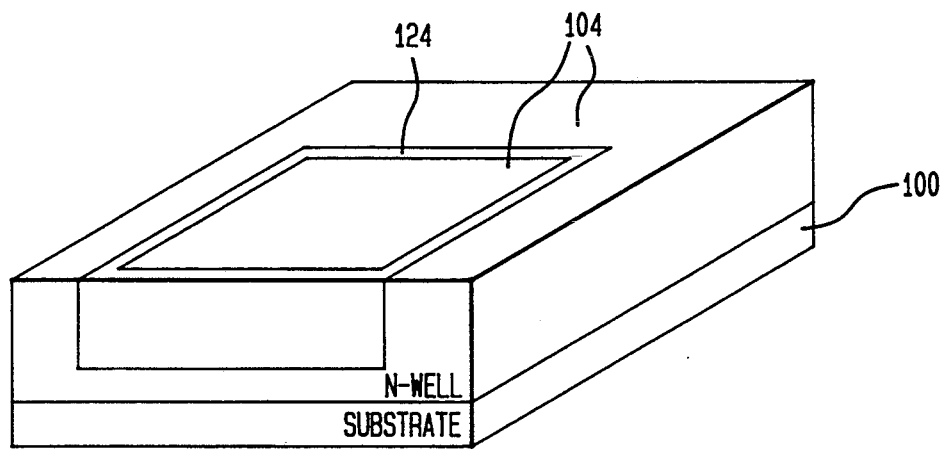
FIG. 3 illustrates the deep guard ring in isometric view.
Figure 2E:
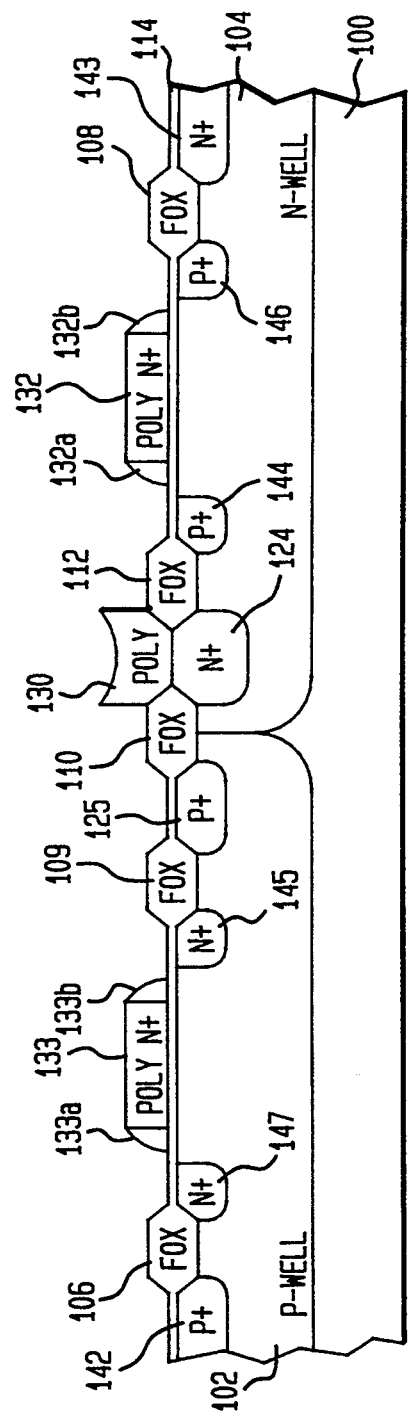

In step D, a poly layer 122, which is heavily doped N+with N-type impurities such as phosphorus, is formed on the thin poly layer 116 and exposed surface window 118 of the N-well 104 (which surface window 118 is exposed in step C). Thereafter, using a thermal diffusion process, N-type impurities are diffused from the poly layer 122 through the window 118 and into the N-well 104 to form the N+region 124. Only a cross-sectional portion of the N+region 124 is shown in step D. As shown in isometric view in FIG. 3, the region 124 illustratively forms a closed perimeter or ring region 124. After forming the ring region 124, a photoresist layer is formed over the portion of the poly layer 122 above the ring region 124. Selected portions of the photoresist region are removed using a photo-lithographic technique. Other regions such as the photoresist regions 126, 127 and 128 are retained at other selected locations on the surface of the poly layer 122 for purposes of forming N+buried contact 130 and poly gates 132 and 133 (step D). The portions of the poly layer 122 not covered by a photoresist region 126, 127, or 128 are then removed, for example, by etching as shown in step E thereby forming poly region 130 and poly gates 132 and 133. The photoresist regions 126, 127, and 128 may then be removed.

Next in step E, conventional N+ and P+source/drain formation processes (including LDD or lightly doped drain, implantation, LDD spacer formation, etc. which are not shown in FIG. 2 step E) are performed. Because these N+ and P+source/drain formation processes are well known in the art, they are not described in detail herein. N+regions 143, 145 and 147 are simultaneously formed during the N+source/drain formation processes. Likewise, P+regions 125, 142, 144 and 146 are simultaneously formed during the N+source/drain formation processes.

Figure 4:
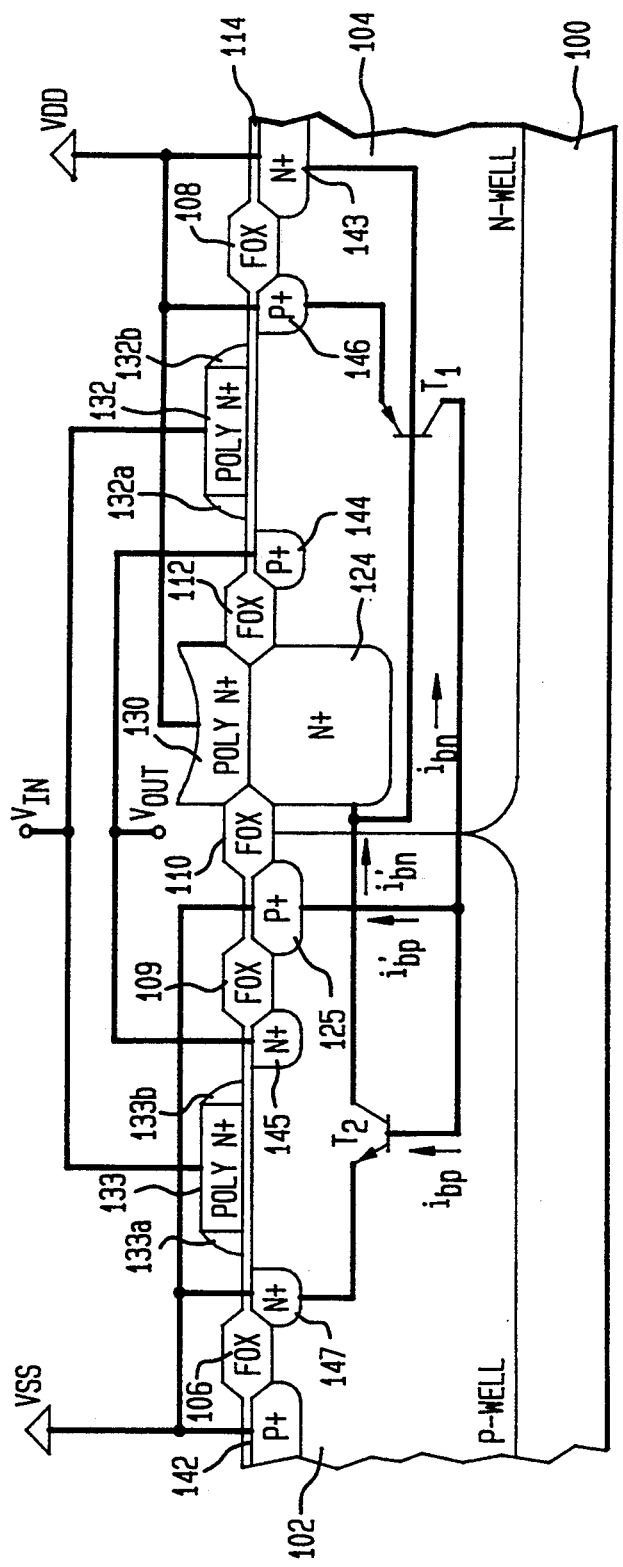
FIG. 4 in cross-sectional view a CMOS device according to the present invention which has a deep collector guard ring formed with process illustrated in FIG. 2.
Figure 5A:
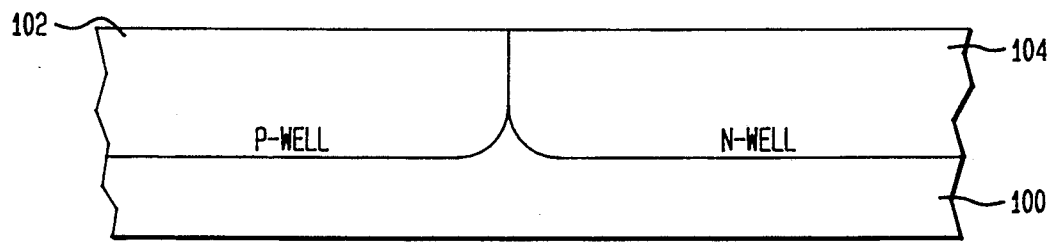
FIG. 5A–5E illustrates the process steps for forming a deep collector guard ring according to another embodiment of the present invention.
Figure 5B:
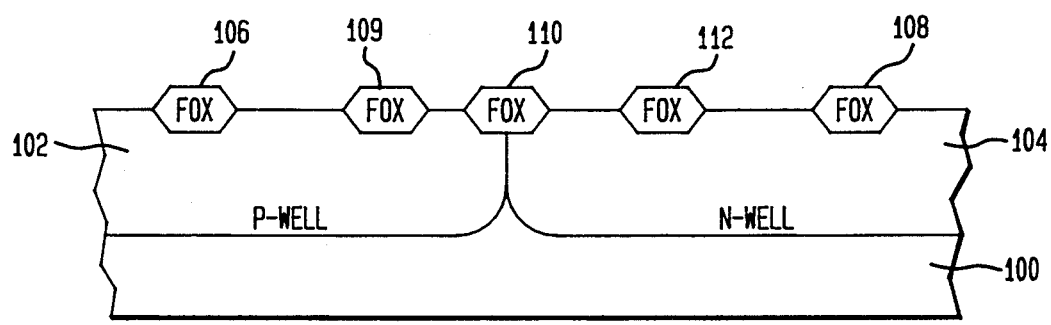
Figure 5C:
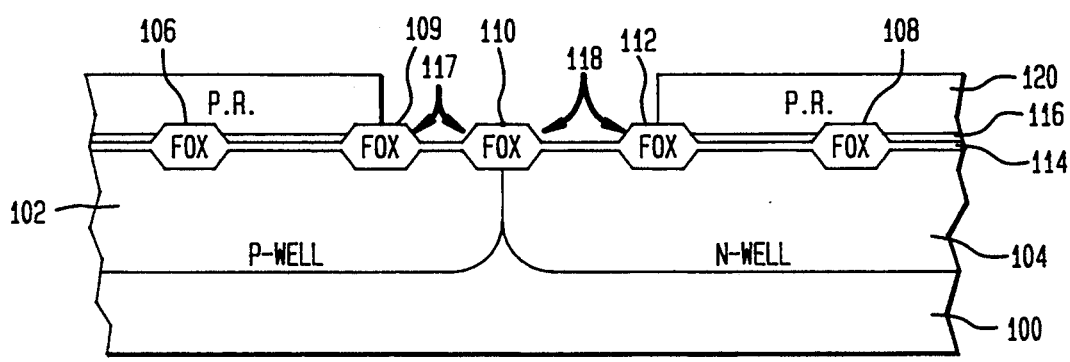
Figure 5D:
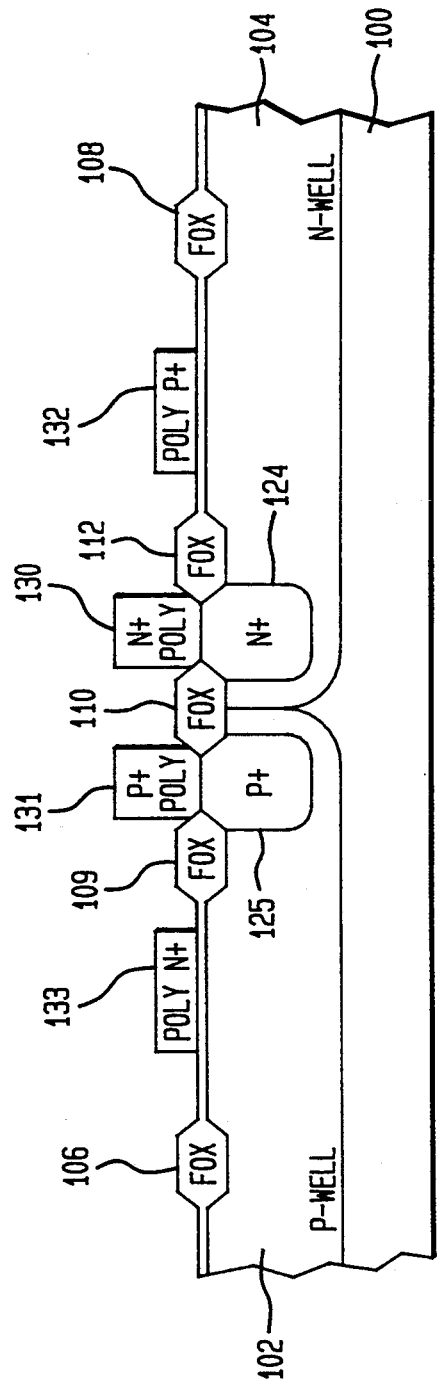
Figure 5E:
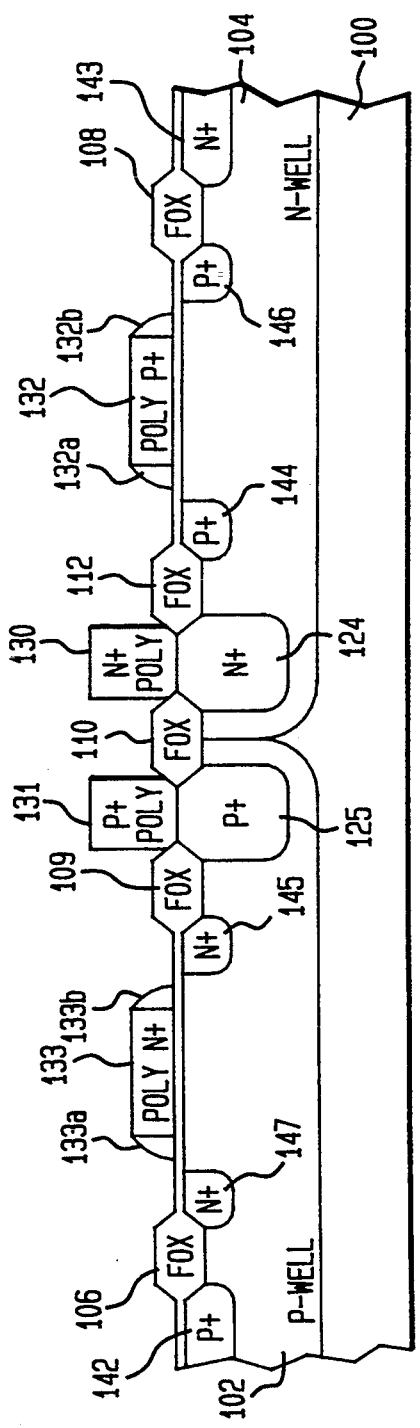

Referring to FIG. 4, a CMOS device 200 with an N+deep collector guard ring 124 formed according to the aforementioned process steps is shown. As shown, the CMOS device 200 has a P-well 102 and an N-well 104 formed in a substrate 100. Illustratively, the depth of the P-well 102 is 1.8 μm and has a doping concentration of $8 \times 10^{16}/cm^3$. The N-well 104 illustratively has a depth of 2.0 μm and a doping concentration of $6 \times 10^{16}/cm^3$. Fox regions 106, 108, 109, 110, and 112 are provided. Between the fox regions 110 and 112, a deep buried N+guard ring 124 is provided which illustratively has a depth of 0.6 μm and a doping concentration of $10^{18}1 cm^3$. An N+poly region 130 is formed above the guard ring 124. Furthermore, an N+poly gate 132 is provided with oxide spacers 132a and 132b. Likewise, an N+poly gate 133 is provided with oxide spacers 133a and 133b. The poly gates 132 and 133 and the poly region 130 illustratively have a doping concentration of $10^{20}/cm^3$.

P+source and drain regions 144 and 146 are formed in the N-well 104 surface adjacent to the poly gate 132. Also, a P+P-well 102 contact region 142 is provided in the surface of the P-well 102. Furthermore, an ordinary guard ring 125 may be provided in the P-well 102. The regions 142, 144 and 146 and guard ring 125 are all illustratively simultaneously formed in the same P+source/drain formation step. Illustratively the regions 142, 144 and 146 and guard ring 125 each has a doping concentration of $10^{20}/cm^3$ and extends into its respective well to a depth of 0.25 μm.

Likewise, N+source and drain regions 145 and 147 are formed in the P-well 102 surface adjacent to the poly gate 133. Also, an N+N-well 104 contact region 143 is provided in the surface of the N-well 104. The source and drain regions 145 and 147 and the N-well contact region 143 are all illustratively simultaneously formed in the same N+source/drain formation step. Illustratively the regions 143, 145 and 147 each has a doping concentration of $10^{20}/cm^3$ and extends into its respective well to a depth of 0.2 μm.

As shown, the CMOS device of FIG. 4 is an inverter with an N+poly gate. The source region 147, guard ring 125 and P-well contact region 142 are illustratively connected to a voltage $V_{ss}$. Likewise, source region 146, guard ring 124/poly region 130 and N-well contact region 143 are all connected to a voltage $V_{DD}$. The poly gates 132 and 133 are connected to an input voltage $V_{in}$. The drain regions 144 and 145 are commonly connected and generate an output voltage $V_{out}$.

The equivalent thyristor circuit formed by the aforementioned structure is also shown with transistors $T_1$ and $T_2$. However, unlike the prior art circuit shown in FIG. 1, the guard rings 124 and 125 minimize the resistances $R_N$ and $R_p$ such that they may be omitted. In particular, the guard rings 124 and 125 efficiently collect the base currents $i_{bp}'$ and $i_{bn}'$ thereby short circuiting the bases of the transistors $T_1$ and $T_2$. Thus, the transistors $T_1$ and $T_2$ tend to remain in the off state thereby providing grater latch-up immunity.

In the CMOS device 200, the N+buried contact guard ring 124 is made in a separate thermal diffusion step as the other regions 142–147 and ordinary guard ring 125. Thus, whereas the ordinary guard ring 125 is only as deep as the regions 142–147, the buried contact guard ring 124 can be made much deeper. As such, the deep buried contact guard ring 124 can collect base current much more efficiently than a shallow guard ring, such as the guard ring 125. The current collection is enhanced without sacrificing circuit packing density (by, for instance, widening the guard ring 124). Furthermore, the thermal diffusion fabrication step is a CMOS compatible process step.

The CMOS device is shown with an ordinary P+guard ring 125 and an N+deep collector guard ring 124 formed according to the present invention. Other variations are possible such as a CMOS device with only an N+deep collector guard ring, an ordinary N+guard ring and a P+deep collector guard ring, only a P+deep collector guard ring, both a P+deep collector guard ring and an N+deep collector guard ring, etc.

If two types of poly gates are to be formed (i.e., N+poly gate for NMOS and P+poly gate for P-MOS) a modified process shown in FIG. 5 may be used to form the CMOS device. In step A, twin wells (P-well 102 and N-well 104) are formed in a substrate 100. In step B, fox regions 108, 109, 110 are grown. Then the thin gate oxide layer 114 is grown and the thin poly layer 116 is formed on the thin gate oxide layer 114. In step C, the photo-resist layer is deposited and photoresist regions are removed above the P-well 102 and N-well 104, respectively. The thin poly layer 116 and gate oxide 114 are removed from these regions to expose surface windows 117 and 118 of the P-well 102 and the N-well 104. Thereafter, a poly layer (without dopants) is formed on the thin poly layer 116 and the exposed surface window 117 of the P-well 102 and the exposed surface window 118 of the N-well 104 (which surface windows are exposed in step B of FIG. 5). Different dopants (N-type or P-type) are implanted into different areas of the poly layer (i.e., N-type dopants above the window 118 and gate area 133 and P-type dopants above the window 117 and gate area 132). The poly layer is then patterned in a fashion similar to that described above.

As shown in step D, N+poly regions are retained at the P-well gate area 133 and N-well guard ring area 130. Likewise, P+poly regions are retained at the N-well gate area 132 and P-well guard ring area 131. Thereafter, N-type and P-type impurities are diffused from the P+poly region 130 and N+poly region into the N-well 104 and P-well 102, respectively to form buried contact guard rings 125 and 124. Then, as shown in step E, conventional source/drain processes may be performed to form the N+regions 143, 145 and 147 and P+regions 142, 144 and 146.

In another variation, a deep N+implantation step is performed during step C of FIG. 2. For example, phosphorus (in the case of an N-type implantation) may be implanted through exposed surface window 118 and into the N-well 104 prior to forming the poly layer 120 (FIG. 2). This step serves to deepen the buried contact 124.

In short, a CMOS device is provided with a deep collector guard ring. The guard ring can be made deeper than the source and drain regions because it is formed in a separate fabrication step. According to one embodiment, the guard ring is formed by thermally deep diffusing impurities from a poly layer into the surface of a well beneath the poly layer. The guard ring can thus be easily manufactured using CMOS compatible fabrication processes.

Finally, the above discussion was intended to be merely illustrative. Numerous alternative embodiments may be devised by those having ordinary skill in the art without departing from the spirit and scope of the following claims.

I claim:

1. A CMOS manufacturing process comprising the steps of:
   forming an N-well and a P-well in a substrate,
   forming a polysilicon layer having at least a portion which is heavily doped with a first conductivity type in a vicinity of at least a portion of a surface of one of said wells,
   forming a guard ring by deep diffusing impurities from said polysilicon layer portion into said surface of said one well, and
   after said step of forming a guard ring, forming P+source and drain regions in said N-well and N+source and drain regions in said P-well, said drains in said N-well and said P-well being separated from each other by said guard ring, wherein said guard ring has a depth greater than said source and drain regions.

2. The process of claim further comprising the steps of:
   forming a thin oxide layer on said wells,
   forming at least one window in said thin layer oxide to expose a portion of said one well,
   forming said silicon polylayer portion over said thin oxide layer and on said exposed portion of said one well.

3. The process of claim 2 further comprising the steps of:
   after forming said guard ring, removing portions of said poly silicon layer except said portion above said window and at least one portion between said drain and said source of said one well.

4. The process of claim 1 wherein a second portion of said poly layer is formed on at least a portion of a surface of another one of said wells, which second poly layer portion is heavily doped with a second conductivity type, said method further comprising the step of:
   forming a second guard ring by deep diffusing impurities from said second poly layer portion into said surface of said other well.

5. The process of claim 1 wherein said step of forming said source and drain regions further comprises the step of simultaneously forming a second guard ring in another one of said wells while forming said source and drain in said one well.

6. The process of claim 1 wherein said one well is said N-well and wherein said first conductivity type is N.

7. The process of claim 1 wherein said guard ring collects a base current of a transistor formed in another one of said wells by said source and drain of said other well and a bulk of material of said other well.

* * * * *